(12) United States Patent
Hazzard et al.

(10) Patent No.: US 7,652,598 B2
(45) Date of Patent: Jan. 26, 2010

(54) SERIAL DATA ANALYSIS IMPROVEMENT

(75) Inventors: Shane A. Hazzard, Cornelius, OR (US);
Que Thuy Tran, Beaverton, OR (US);
Kayla R. Klingman, Portland, OR (US);
David L. Kelly, Portland, OR (US);
Patrick A. Smith, Beaverton, OR (US);
Daniel G. Knierim, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 11/925,685

(22) Filed: Oct. 26, 2007

(65) Prior Publication Data

US 2009/0109071 A1    Apr. 30, 2009

(51) Int. Cl.
*H03M 9/00* (2006.01)
(52) U.S. Cl. .................. 341/100; 341/95; 370/509
(58) Field of Classification Search .................. 341/95, 341/100; 370/509, 535–545
See application file for complete search history.

(56) References Cited

U.S. PATENT DOCUMENTS 6,184,808 B1 * 2/2001 Nakamura .................... 341/95
2002/0080824 A1 * 6/2002 Wingrove .................... 370/509

* cited by examiner

*Primary Examiner*—Jean B Jeanglaude
(74) *Attorney, Agent, or Firm*—Francis I. Gray; Thomas F. Leniham

(57) ABSTRACT

A method for improving performance and flexibility of serial data analysis in test instruments, is independent of data bit rate, encoding scheme or communication protocol embodied in the serial data. The serial data is input to a transmitter section, where it is demultiplexed into a plurality of multi-bit lanes, such as n bits for each of N lanes. The N lanes are then encoded into characters, the encoded N lanes having m bits per lane where m>n. Bit stuffing is used to adjust the data rate and/or to insert qualifiers. The stuffed, encoded N lanes are then multiplexed into N serial lanes, which are output from the transmitter section for input to a receiver section at a data rate that is optimal for the receiver section. In the receiver section the N lanes are deserialized, decoded and input to a word recognizer to generate a trigger event signal.

12 Claims, 2 Drawing Sheets

NQ STANDS FOR NON-QUALIFIED

SERIAL DATA ANALYSIS IMPROVEMENT

FIELD OF THE INVENTION

The present invention relates to serial data analysis, and more particularly to a method of increasing flexibility and performance of serial data analysis in a test instrument.

BACKGROUND OF THE INVENTION

Certain serial data applications, such as data recording and serial data packet triggering, require receivers to have a very low bit error rate (BER), even in the presence of an input signal that may have worse noise characteristics than allowed by off-the-shelf components. Serial data test instruments have relied on either custom-designed application specific integrated circuits (ASICs) for maximum performance, or off-the-shelf serializer/deserializers (SERDES) and/or field programmable gate arrays (FPGAs) for flexibility.

ASICs may be designed to achieve excellent performance with respect to noise tolerance and operating speed. However ASICs lack flexibility, as not every possible need can be foreseen. As markets change, popular serial data protocols also change. Designing an ASIC to keep up with these changes requires building in more features, which adds to component cost, design time, power requirements and programming complexity. Even then, the amount of support available is limited to speculation.

A flexible off-the-shelf solution uses either an off-the-shelf SERDES connected to an FPGA, or an FPGA with a built-in SERDES. The FPGA may be reprogrammed to implement new trigger functionality or record data as needed by the test instrument. However the performance is limited to the SERDES manufacturer's capabilities and design goals, which often assume a functional data link to meet bit error rate specifications. Since test instruments are required to function in an environment where the data link is not known to be functional, or is known to be dysfunctional, off-the-shelf components don't solve the general purpose measurement instrument need.

Prior designs have included combining ASICs with off-the-shelf SERDES where the ASIC provides a reference clock for the SERDES or FPGA. These systems are still limited as (i) they can support only the protocols allowed by the SERDES; (ii) they are limited to the maximum signaling rate supported by the SERDES; and (iii) if the data is not retimed by the ASIC to remove timing noise, they are limited to the noise performance of the SERDES which likely does not meet the goals desired by the test instrument.

What is desired is a method of improving the performance and flexibility of serial data analysis in test instruments regardless of data bit rate, encoding scheme or communication protocol embodied in the serial data.

SUMMARY OF THE INVENTION

Accordingly the present invention provides an improvement in performance and flexibility of serial data analysis in test instruments that is independent of data bit rate, encoding scheme or communication protocol embodied in the serial data. The serial data is input to a transmitter section, where it is demultiplexed into a plurality of multi-bit lanes, such as n bits for each of N lanes. The N lanes are then encoded into characters, the encoded N lanes having m bits per lane where m>n. Bit stuffing is used to adjust the data rate and/or to insert qualifiers. The stuffed, encoded N lanes are then multiplexed into N serial lanes, which are output from the transmitter section for input to a receiver section at a rate that is optimal for the receiver section. In the receiver section the N lanes are deserialized, decoded and input to a word recognizer to generate a trigger event signal.

The objects, advantages and other novel features of the present invention are apparent from the following detailed description when read in conjunction with the appended claims and attached drawing figures.

DETAILED DESCRIPTION OF THE DRAWING

The method described below demultiplexes serial data into multiple multi-bit lanes or multiple paths of serial data without regard to the bit rate, encoding scheme or communication protocol embodied in the serial data. For example 2.5 Gb/s PCI-Express 8b10b serial data may be demultiplexed to multiple lower speed serial lanes for eventual interpretation by a receiver. The same circuits may be applied to 10 Gb/s Ethernet 64b/66b serial data or 12.5 Gb/s non-standard PRBS data streams.

Figure 1:
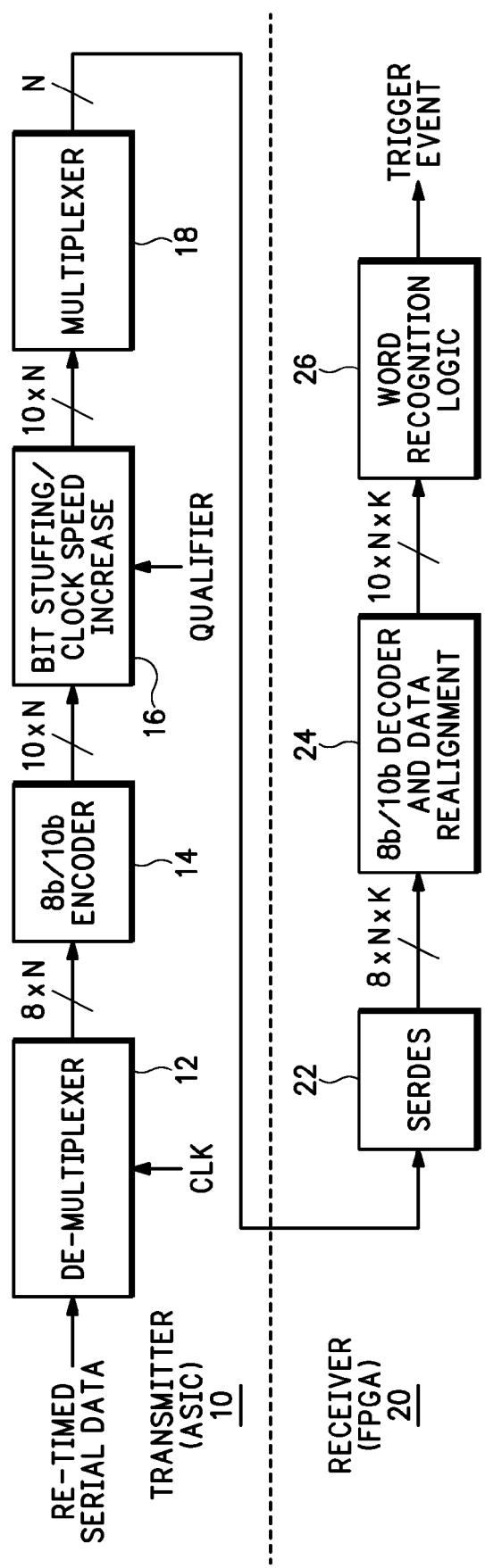
FIG. 1 is a block diagram view of an input section for a test instrument according to the present invention.

Referring now to FIG. 1 a block diagram is shown for a system that improves performance and flexibility of serial data analysis in a test instrument. A serial data signal is received by a test instrument by a clock/data recovery (CDR) circuit, as is well known in the art, to provide a re-timed serial data signal and a signal clock. The re-timed serial data and signal clock, or alternatively an external system clock subdivided to be the signal clock, are input to a transmitter section 10 of the test instrument where it is demultiplexed into N serial data streams. The N serial data streams are input to a conventional receiver section 20 at a rate that is within the optimal rate range for the receiver section. The receiver section 20 then outputs a trigger event signal for acquisition of the serial data signal by the test instrument.

As shown, the re-timed serial data signal is input to a demultiplexer 12 that is clocked by the signal clock to provide n×N serial data paths with the data rate in each path being 1/(n×N) times the signal clock rate. The n×N serial data paths are input to an encoder 14, such as an 8b/10b encoder, which provides m×N encoded serial data paths at an output, where m>n. A bit stuffer 16 receives the m×N encoded serial data paths and inserts additional information or duplicated bits into the encoded serial data paths to adjust to a desired clock rate and/or to insert a trigger qualifier. The resulting stuffed mxN encoded serial data paths are input to an output multiplexer 18 acting as a serializer to produce the N serial data streams at a clock rate that is within the optimal data rate range for the receiver section 20.

The receiver section 20 is a conventional receiver that includes a SERDES 22 which converts the N serial data paths into encoded m×K×N serial data paths, which in turn are input to a decoder 24 to produce n×K×N serial data paths. The output from the decoder 24 is input to a word recognizer 26 that produces the trigger event from the nxKxN serial data paths. In other words the receiver section 20 recovers the original serial data in parallel form.

The transmitter 10 may be implemented as an ASIC to provide excellent performance with respect to noise tolerance and operating speed, while the receiver section 20 may be implemented with off-the-shelf SERDES and/or FPGA components to provide the desired flexibility.

Figure 2:
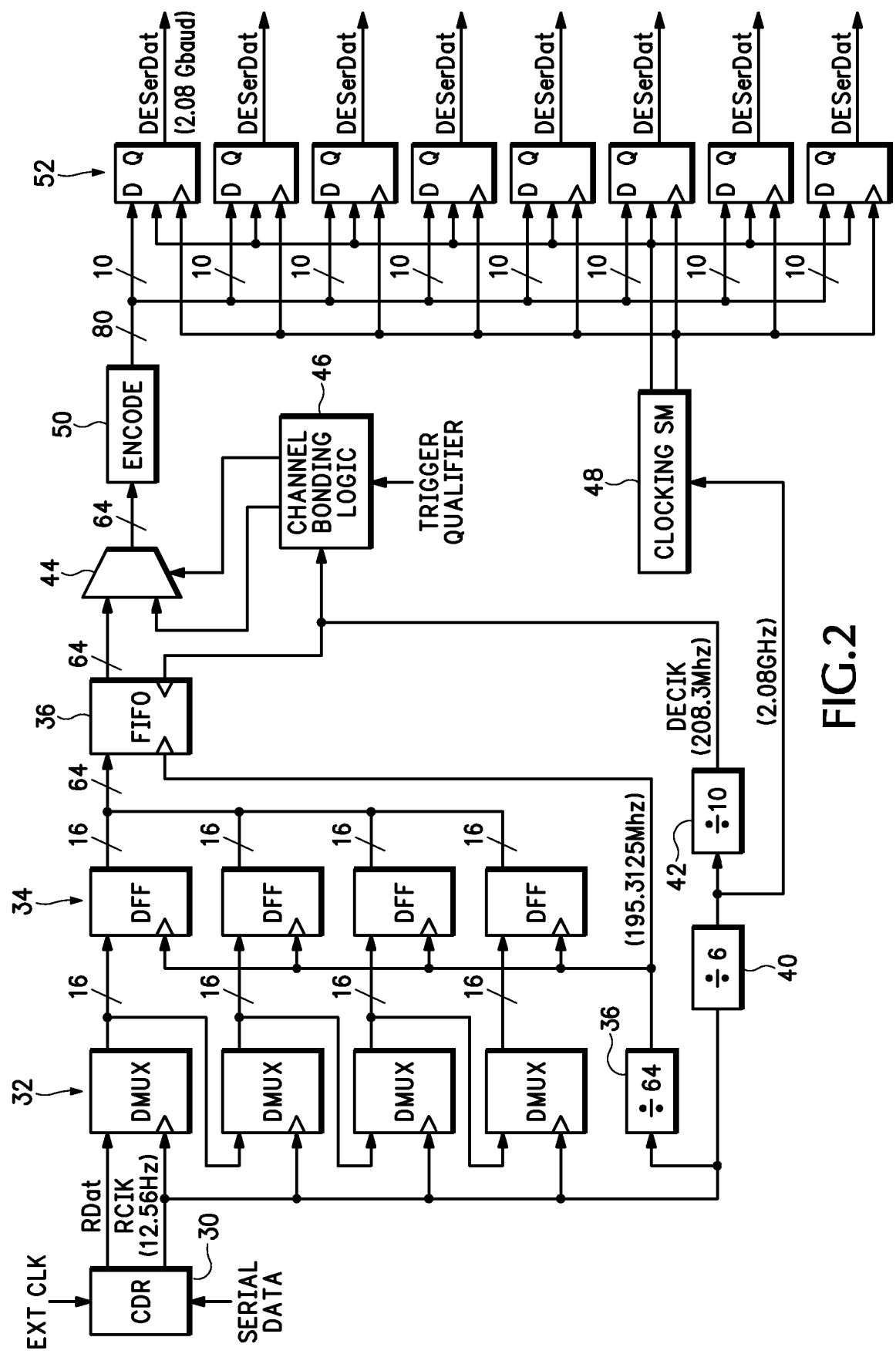
FIG. 2 is a more detailed, specific block diagram view of the input section for the test instrument according to the present invention.

FIG. 2 provides a more detailed implementation of the present invention with representative clock rates. A serial data signal is input to a clock and data recovery circuit 30, which in turn outputs retimed data, RDat, and a recovered clock, RClk. Alternatively RClk may be a divided version of an external voltage controlled oscillator (VCO) clock or system clock. In the described implementation RDat is clocked into a series of four divide-by-16 demultiplexers 32 by RClk. In this example RClk has a clock rate of 12.5 GHz. The divide-by-16 demultiplexers 32 each provide a 16-bit parallel output to respective sets of D-type flip-flops 34. The D-type flip-flops 34 are clocked simultaneously by a divided version of RClk, in this example being output from a divide-by-64 circuit 36 to produce a 195.3125 MHz clock. The result is that RDat is transferred to a first-in/first-out (FIFO) buffer memory 38 as 64-bit data or 64 (n×N) serial data paths. A pair of dividers 40, 42 provide a pair of clocks equivalent to RClk/6 and RClk/60. RClk/60 is a data encoder clock, DEClk. The 64-bit parallel data from the FIFO 38 is clocked out using RClk/60, which in this example is 208.3 MHz, i.e., a higher clock rate than the FIFO input clock rate of 195.3125 MHz. The output from the FIFO 38 is input to a multiplexer 44 that is controlled by a channel bonding control logic circuit 46. Due to the higher output clock rate for the FIFO 38 the channel bonding control logic circuit 46 periodically inserts a 64-bit word into the FIFO output stream via the multiplexer 44 where an empty word would otherwise appear. The 64-bit word may be a trigger qualifier word provided to the channel bonding control logic circuit 46 or a pseudo-random word to fill the data stream. The resulting 64-bit data stream is then input to a data encoder 50, such as the 8b/10b encoder shown. The overhead required for 8b/10b encoding is ×1.25 plus some overhead for channel bonding. The output/input ratio here is 4/3. Therefore the encoder 50 outputs a 10-bit bonding pattern for every fifteen characters on each lane. The overhead for the bonding pattern is:

$(n+1)/n = 64/60$ $n = 1/(64/60 - 1) = 1/(4/60) = 15$

Therefore fifteen 10-bit characters are output from the encoder 50 per lane followed by one 10-bit bonding pattern.

Output from the encoder 50 in this example is an 80-bit parallel data stream representing eight lanes of 10-bit characters, which are input to respective latches 52 at the DEClk rate and then clocked out serially at the RClk/6 (divide-by-6) rate. A clocking state machine 48 provides the RClk/6 to the latches 52 timed so that the N serial data streams are timed correctly with each other. This produces eight lanes of serial data for input to the receiver section 20. Therefore the serial input signal is demultiplexed into essentially eight lanes of 8-bit data, which are then encoded into eight lanes of 10-bit characters. Each lane is then serialized to produce the eight lanes of serial data for the receiver section 20, i.e., N=8. The data rate of the eight lanes of serial data from the transmitter 10 is configured to be within the optimal data rate range for the SERDES 22 of the receiver section 20.

For slower data rate serial data, i.e., serial data that has a lower rate than is optimal for the receiver SERDES 22, the external or system clock may be used as RClk to oversample the serial data into the desired number of lanes. The data is demultiplexed, encoded and serialized as before prior to being transmitted to the receiver section 20 at a data rate compatible with the receiver SERDES 22.

As a result a test instrument having such a transmitter/receiver combination at its input is not dependent on any data rate, encoding standard or communication protocol. Whatever data is received by the demultiplexer 12 is passed over the multiple lanes to the receiver section 20 without change or interpretation at whatever data rates are supported by the receiver section. Any specific functionality required for an operating mode may be implemented in a flexible architecture, including receiver SERDES 22 and processor or FPGA. The requirements for the FPGA or other off-the-shelf receiver components are relaxed, as the receiver section 20 may receive data on a multitude of channels at a much slower rate than the original data rate (for high speed serial data), it may receive data from a data source with original jitter content well beyond the receiver performance specifications, and it may receive data on a multiple of channels asynchronously (not shown) at a much faster rate than the original data rate to support data rates lower than those which the receiver natively supports.

Further the above-described technique allows sampling a multitude of channels asynchronously where the channels' information content is well below the Nyquist frequency of the data encoder 14. This allows support of low speed serial protocols, such as IIC (Inter-integrated Circuit) and SPI (Serial Peripheral Interface). The receiver logic may be reconfigured to scan through the sampled data, looking for edges from which to infer the data stream contents.

The bit stuffing circuitry 16 has multiple uses. Bit-stuffing is required for channel bonding—timing alignment between the various lanes may be made known with a special channel bonding character, such as described in the Xilinx data sheet for the Virtex-4 series of FPGAs. Bit-stuffing may be used to keep the output data rate within design limits. For instance if the incoming data is at a rate below what can be supported by the SERDES 22, extra bits may be injected into the data stream to force the data rate to the SERDES to be within design limits. The bit-stuffing provides the ability to communicate information in real-time to the receiver section 20 using special characters.

Figure 3:
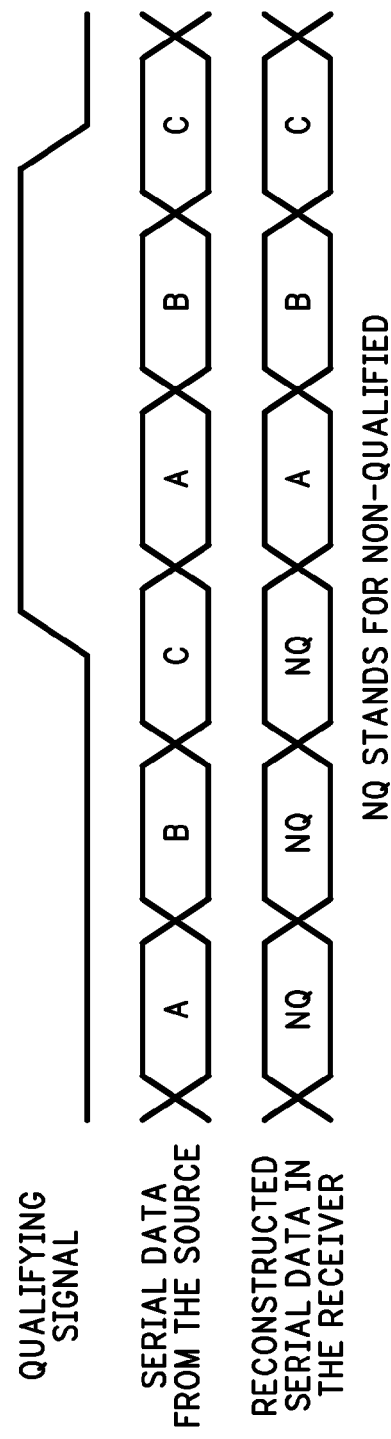
FIG. 3 is a graphic view illustrating the use of qualifiers according to the present invention.

For a trigger system a qualification signal may be used to gate the incoming serial data so that, when the qualifier is deasserted, the bit-stuffer inserts a special qualifier character. When the qualifier later asserts with the insertion of another special qualifier character, the demultiplexed data is then allowed to be processed by the receiver section 20. The receiver section 20 may then receive a serial data stream that has been qualified by the transmitter ASIC in some way. As shown in FIG. 3 a user may want to trigger on the "A" serial data word, but only when a qualifying signal is "high." The trigger system may use the bit-stuffing circuit 16 to insert a first specially recognized control character that the receiver section 20 interprets as a Non-Qualified (NQ) character. A second specially recognized control character is inserted by the bit-stuffing circuit 16 to assert the qualifying signal, and the multiple lanes from the transmitter section 10 to the receiver section 20 are then analyzed to cause a trigger event to be generated from the word recognition logic 26.

The 8b/10b data encoder 14 in the transmitter 10 may be replaced by any number of other encoders, such as 64b/66b or a SONET scrambler, as long as the receiver section 20 supports the protocol. Also as indicated above the receiver section 20 may be a SERDES 22 within an FPGA or a SERDES/FPGA pair of components.

Thus, the present invention provides improved performance and flexibility for serial data analysis by demultiplexing a serial data signal into multiple lanes of multi-bit data, encoding the lanes of multi-bit data to form an encoded data stream, bit-stuffing the encoded data stream as desired to achieve a desired data rate and/or to include qualifiers, and then serializing each of the multiple multi-bit lanes at a rate supported by a receiver for analyzing the serial data.

What is claimed is:

1. An apparatus for processing serial data comprising:
   a transmitter section having as an input the serial data and having as an output N serial data paths at a desired data rate; and
   a receiver section having as inputs the N serial data paths and having as an output a trigger event for the serial data, wherein the desired data rate is within an optimal rate range for the receiver section.

2. The apparatus as recited in claim 1 wherein the transmitter section comprises:
   a demultiplexer having as an input the serial data and producing as an output nxN data paths using a high speed clock signal;
   an encoder having as inputs the nxN data paths to produce mxN encoded data paths, where m>n;
   means for stuffing additional data in the mxN encoded data paths to produce mxN stuffed data paths; and
   a multiplexer having as inputs the mxN stuffed data paths and having as an output the N serial data paths at the desired data rate.

3. The apparatus as recited in claim 2 wherein the high speed clock signal is derived from the serial data.

4. The apparatus as recited in claim 2 wherein the high speed clock signal is derived from an external clock.

5. The apparatus as recited in claim 2 wherein the additional data comprises a trigger qualifier.

6. The apparatus as recited in claim 2 wherein the stuffing means comprises:
   a buffer having as an input the nxN data paths at a first clock rate derived from the high speed clock signal and providing as an output the nxN data paths at the second clock rate derived from the high speed clock signal, the second clock rate being faster than the first clock rate;
   an insertion multiplexer having a first input coupled to the output of the buffer for receiving the nxN data paths and having a second input coupled to receive a bonding character as the additional data; and
   a logic control circuit having the second clock rate as an input and providing the bonding character as an output, the logic control circuit further providing a control signal to the insertion multiplexer to insert the bonding character into the nxN data paths so that the encoder produces the mxN stuffed data paths at the desired data rate.

7. A method of processing serial data comprising the steps of:
   converting the serial data into a plurality of serial data paths at a desired data rate; and
   processing the plurality of serial data paths to output a trigger event for the serial data, wherein the desired data rate is within an optimal rate range for the processing step.

8. The method as recited in claim 7 wherein the converting step comprises the steps of:
   demultiplexing the serial data into nxN data paths using a high speed clock signal;
   encoding the nxN data paths into mxN encoded data paths, where m>n;
   stuffing additional data into the mxN encoded data paths to produce mxN stuffed data paths; and
   multiplexing the mxN stuffed data paths to output the plurality of serial data paths at the desired data rate.

9. The method as recited in claim 8 wherein the high speed clock signal is derived from the serial data.

10. The method as recited in claim 8 wherein the high speed clock signal is derived from an external clock.

11. The method as recited in claim 8 wherein the additional data comprises a trigger qualifier.

12. The method as recited in claim 8 wherein the stuffing step comprises the steps of:
    buffering the nxN data paths at a first clock rate derived from the high speed clock signal to provide the nxN data paths at a second clock rate derived from the high speed clock signal, the second clock rate being faster than the first clock rate; and
    inserting a bonding character as the additional data into the nxN data paths produced by the buffering step so that the mxN stuffed data paths are at the desired data rate.

* * * * *